United States Patent
Bovington et al.

(10) Patent No.: US 10,547,156 B1
(45) Date of Patent: Jan. 28, 2020

(54) SUBMOUNT FOR SEMICONDUCTOR LASER AND OPTICAL FIBERS

(71) Applicant: Cisco Technology, Inc., San Jose, CA (US)

(72) Inventors: Jock T. Bovington, La Mesa, CA (US); Ashley J. Maker, Pleasanton, CA (US); Kumar Satya Harinadh Potluri, Milpitas, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/052,441

(22) Filed: Aug. 1, 2018

(51) Int. Cl.
*H01S 5/022* (2006.01)
*G02B 6/42* (2006.01)
*G02B 6/12* (2006.01)
*H01S 5/02* (2006.01)

(52) U.S. Cl.
CPC ...... *H01S 5/02236* (2013.01); *G02B 6/12019* (2013.01); *G02B 6/4296* (2013.01); *H01S 5/02284* (2013.01); *H01S 5/021* (2013.01); *H01S 5/0207* (2013.01)

(58) Field of Classification Search
CPC ............ H01S 5/02236; H01S 5/02284; H01S 5/0207; H01S 5/021; G02B 6/4296; G02B 6/12019
See application file for complete search history.

(56) References Cited

U.S. PATENT DOCUMENTS

| | | | |
|---|---|---|---|
| 5,853,626 A * | 12/1998 | Kato | G02B 6/4214 264/1.25 |
| 6,817,777 B1 | 11/2004 | Grabbe | |
| 7,724,990 B2 | 5/2010 | Ishida | |
| 8,873,908 B2 | 10/2014 | Hu et al. | |
| 9,046,690 B2 * | 6/2015 | Sabry | G02B 26/0841 |
| 2015/0236472 A1* | 8/2015 | Ide | G02B 26/00 362/553 |

OTHER PUBLICATIONS

U.S. Appl. No. 15/636,262 "TSV Compatible Fiber Array Coupler for Silicone Photonics", as filed on Jun. 28, 2017.
U.S. Appl. No. 15/841,005 tilted "Passive Fiber Coupler With UV Windows," , as filed on Dec. 13, 2017.

* cited by examiner

*Primary Examiner* — Armando Rodriguez
(74) *Attorney, Agent, or Firm* — Patterson + Sheridan, LLP

(57) ABSTRACT

A submount assembly comprises a first substrate having a first surface and an opposing second surface, wherein a plurality of first grooves are formed into the first substrate from the first surface. Each first groove is dimensioned to receive a portion of a respective optical fiber of a plurality of optical fibers, and to arrange the optical fiber with a predetermined first height relative to the first surface. The submount assembly further comprises a plurality of first conductive traces on a side of the first substrate corresponding to the first surface, and a semiconductor laser contacted with the first conductive traces. The semiconductor laser has a predetermined second height relative to the first surface. The submount assembly further comprises a plurality of second conductive traces at the second surface and a plurality of first vias extending through the first substrate from the first conductive traces to the second conductive traces.

20 Claims, 13 Drawing Sheets

SUBMOUNT FOR SEMICONDUCTOR LASER AND OPTICAL FIBERS

TECHNICAL FIELD

Embodiments presented in this disclosure generally relate to optical interconnects for photonics systems, and more specifically, techniques for attaching a semiconductor laser and optical fibers in a submount.

BACKGROUND

In photonics systems, such as silicon photonics, a significant portion of the die area is needed for separately interfacing with a laser submount and with a fiber attach unit (FAU). Using separate interfaces tends to result in a reduced amount of functionality (optical components and/or electronic components) for a given die area, or requiring a larger die to implement a given amount of functionality. Additionally, performing separate alignment processes for the laser and the optical fibers corresponds to significant expense (e.g., different alignment machinery) and reduced throughput during manufacturing.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is

DESCRIPTION OF EXAMPLE EMBODIMENTS

OVERVIEW

Figure 1:
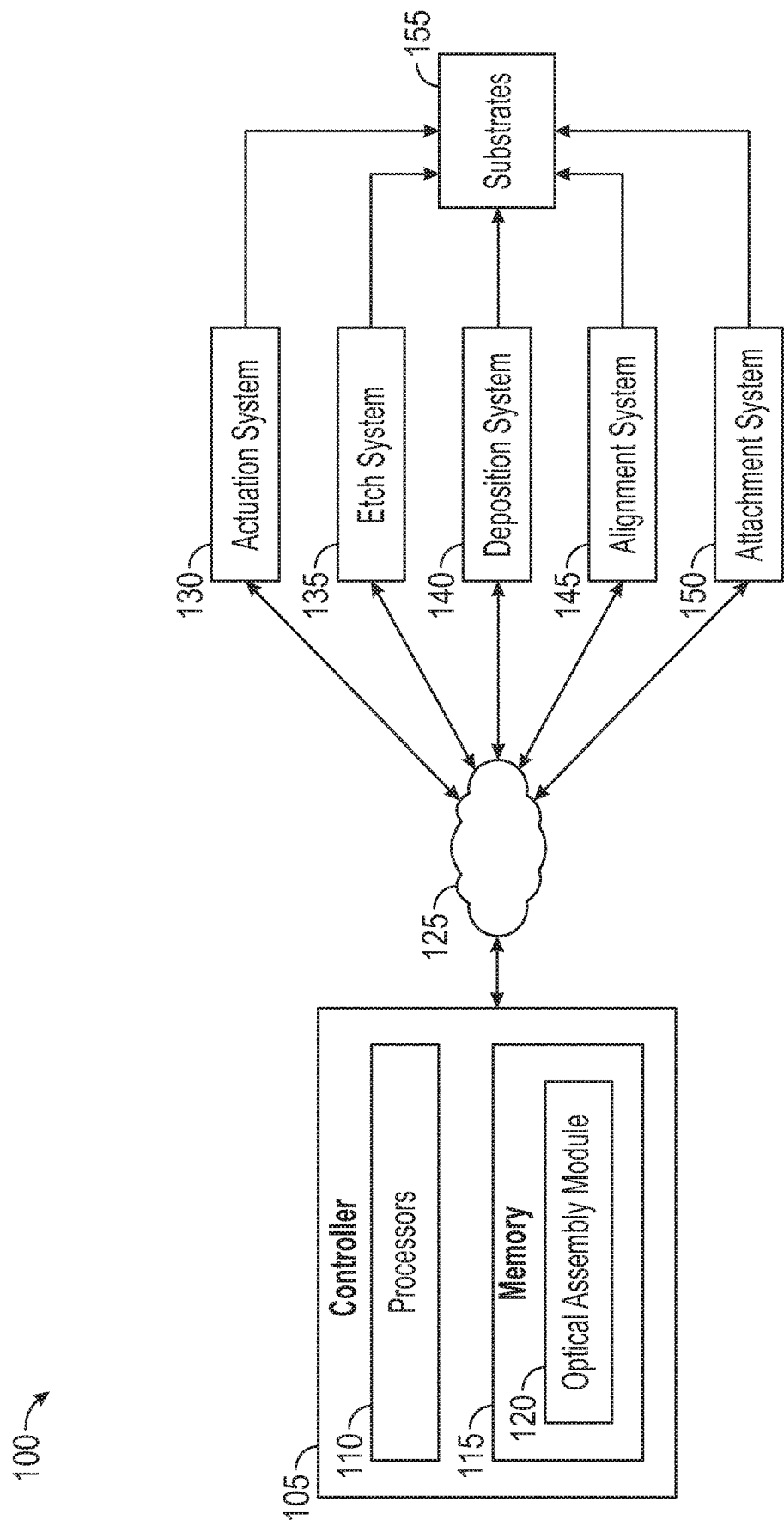
FIG. 1 is a block diagram of an exemplary system for constructing an optical apparatus, according to one or more embodiments.

One embodiment presented in this disclosure is a submount assembly comprising a first substrate having a first surface and an opposing second surface. A plurality of first grooves is formed into the first substrate from the first surface. Each first groove is dimensioned to receive a portion of a respective optical fiber of a plurality of optical fibers, and to arrange the optical fiber with a predetermined first height relative to the first surface. The submount assembly further comprises a plurality of first conductive traces on a side of the first substrate corresponding to the first surface, and a semiconductor laser contacted with the first conductive traces. The semiconductor laser has a predetermined second height relative to the first surface. The submount assembly further comprises a plurality of second conductive traces at the second surface, and a plurality of first vias extending through the first substrate from the first conductive traces to the second conductive traces.

Another embodiment presented in this disclosure is an optical apparatus comprising a semiconductor substrate having a first surface and a plurality of optical waveguides arranged with a predetermined first height relative to the first surface, a semiconductor laser, a plurality of optical fibers, and a submount assembly. The submount assembly comprises a base member having a second surface and an opposing third surface. The second surface contacts the first surface. A plurality of first grooves are formed into the base member from the second surface. Each first groove receives a portion of a respective optical fiber of the plurality of optical fibers, and arranges the optical fiber to be optically coupled with a respective optical waveguide of the plurality of optical waveguides. The submount assembly further comprises a plurality of first conductive traces on a side of the base member corresponding to the first surface. The semiconductor laser is contacted with the first conductive traces and has a predetermined second height relative to the first surface. The submount assembly further comprises a plurality of second conductive traces at the third surface, and a plurality of first vias extending through the base member from the first conductive traces to the second conductive traces.

Another embodiment presented in this disclosure is a method comprising forming a plurality of first vias through a base member. The base member has a first surface and an opposing second surface. The method further comprises forming a plurality of first conductive traces on a side of the base member corresponding to the first surface, and forming a plurality of second conductive traces at the second surface. The first vias extend between the first conductive traces and the second conductive traces. The method further comprises forming a plurality of first grooves from the first surface into the base member, and attaching a plurality of optical fibers to the base member. Attaching the plurality of optical fibers comprises inserting the plurality of optical fibers into the plurality of first grooves. The plurality of optical fibers have a predetermined first height relative to the first surface. The method further comprises attaching a semiconductor laser to the base member. Attaching the semiconductor laser comprises contacting the semiconductor laser with the first conductive traces. The semiconductor laser has a predetermined second height relative to the first surface.

EXAMPLE EMBODIMENTS

Embodiments discussed herein are generally directed to a submount assembly capable of providing a single interface of a semiconductor laser and multiple optical fibers with a semiconductor substrate. In some embodiments, the submount assembly comprises a substrate having a plurality of grooves formed into a first surface, wherein each groove is dimensioned to receive a portion of a respective optical fiber, and to arrange the optical fiber with a predetermined first height relative to the first surface. The submount assembly further comprises a plurality of conductive traces on a side of the substrate corresponding to the first surface. When the semiconductor laser is contacted with the conductive traces, the semiconductor laser has a predetermined second height relative to the first surface. The substrate may further comprise a plurality of vias extending from the conductive traces to a plurality of second conductive traces at a second surface of the substrate opposite the first surface.

In some embodiments, the substrate is a base member and the submount assembly further comprises a lid member configured to contact the base member. The lid member may be a second substrate, and in some cases may have grooves formed into the second substrate such that each optical fiber is arranged between a groove of the base member and a groove of the lid member. For example, the grooves may comprise U-shaped grooves or V-shaped grooves. Alternatively, the lid member may include one or more alignment features for aligning with the base member.

Beneficially, controlling the heights of the optical fibers and the semiconductor laser relative to the first surface of the substrate can result in a less complex and/or less costly alignment process of the submount with a semiconductor substrate. More specifically, combining these two alignment aspects into one can result in a reduced bill of materials, reduced capital equipment such as bonders, and so forth. The reduced complexity may support increased production, as fewer process steps can correspond to a greater throughput for a given number of bonders.

FIG. 1 is a block diagram of an exemplary system 100 for constructing an optical apparatus, according to one or more embodiments. Features of the system 100 may be used in conjunction with other embodiments, such as the optical apparatus 505 of FIGS. 5A, 5B or the optical apparatus 805 of FIGS. 8A, 8B, which are discussed below.

The system 100 comprises a controller 105 comprising one or more computer processors 110 and a memory 115. The one or more computer processors 110 represent any number of processing elements that each can include any number of processing cores. Some non-limiting examples of the one or more computer processors 110 include a microprocessor, a digital signal processor (DSP), an application-specific integrated chip (ASIC), and a field programmable gate array (FPGA), or combinations thereof. The memory 115 may comprise volatile memory elements (such as random access memory), non-volatile memory elements (such as solid-state, magnetic, optical, or Flash-based storage), and combinations thereof. Moreover, the memory 115 may be distributed across different mediums (e.g., network storage or external hard drives).

The memory 115 may comprise a plurality of "modules" for performing various functions described herein. In one embodiment, each module includes program code that is executable by one or more of the computer processors 110. However, other embodiments may include modules that are partially or fully implemented in hardware (i.e., circuitry) or firmware of the controller 105. As shown, the memory 115 comprises an optical assembly module 120 configured to control various stages of manufacturing (or assembling) an optical apparatus. The optical assembly module 120 is configured to communicate control signals to one or more systems via a network 125. The network 125 may include one or more networks of various types, including a personal area network (PAN), a local area or local access network (LAN), a general wide area network (WAN), and/or a public network (e.g., the Internet).

As shown, the system 100 comprises an actuation system 130, an etch system 135, a deposition system 140, an alignment system 145, and an attachment system 150, each of which is communicatively coupled with the controller 105 via the network 125. Based on control signals received from the controller 105, one or more of these systems may be configured to manipulate one or more substrates 155, such as semiconductor substrates and/or glass substrates when constructing the optical apparatus.

In some embodiments, the actuation system 130 is configured to alter an orientation of the substrates 155 (e.g., translation and/or rotation) between different stages of processing, maintain an orientation of the substrates 155 during the processing, and so forth. For example, the actuation system 130 may comprise one or more robotic arms and/or gripping systems.

In some embodiments, the etch system 135 is configured to etch the substrates 155 to form features therein, according to any suitable etching technique(s). For example, the etch system 135 may be configured to form openings through the substrates 155 for forming vias, form grooves from a surface of the substrates 155, form a recess from the surface, and so forth. In one embodiment, the etch system 135 uses an anisotropic etch process such as deep reactive-ion etching (DRIE). In an alternate embodiment, one or more functions of the etch system 135 may be performed using other techniques, such as laser drilling or machining.

In some embodiment, the deposition system 140 is configured to deposit conductive material onto the substrates 155. For example, the deposition system 140 may form vias in the openings etched or otherwise formed in the substrates 155, may form conductive traces at one or more surfaces of the substrates 155, and so forth. In some embodiments, vias extend through the substrates 155 from conductive traces on a first side of the substrates 155 to conductive traces on a second side of the substrates 155.

As part of constructing the optical apparatus, a semiconductor laser, a plurality of optical fibers, and/or other optical and/or electronic components may be placed on the substrates 155. In some embodiments, the alignment system 145 is configured to perform an optical alignment of the semiconductor laser and/or the plurality of optical fibers. For example, the alignment system 145 may comprise an active alignment system configured to provide optical signals to the optical fibers and/or apply an electrical signal to the semiconductor laser to generate an optical signal.

In some embodiments, the alignment system 145 is used to optically align the semiconductor laser and the plurality of optical fibers after attachment to the substrates 155. For example, the alignment system 145 may manipulate the substrates 155 to align the semiconductor laser and the plurality of optical fibers with respective waveguides formed in a semiconductor substrate. In other embodiments, the alignment system 145 may operate in conjunction with the actuation system 130 to manipulate the substrates 155 and/or the semiconductor substrate.

In some embodiments, the attachment system 150 is configured to attach the substrates 155 with one or more of: other substrates 155, the semiconductor substrate, the plurality of optical fibers, the semiconductor laser, and other optical and/or electronic components according to any suitable techniques. In some embodiments, the attachment system 150 may be used in multiple attachment stages. For example, the attachment system 150 may be configured to apply an epoxy between the optical fibers and a first one of the substrates 155, to apply an epoxy between the first one and a second one of the substrates 155, to apply an epoxy between the first one of the substrates 155 and a semiconductor substrate, and so forth. The attachment system 150 may further be configured to cure the epoxy, e.g., by applying an ultraviolet (UV) light.

In some embodiments, the attachment system 150 may further be configured to apply conductive material to couple the semiconductor laser and/or other electronic components with conductive traces on the substrates 155. For example, the attachment system 150 may apply a conductive layer to bond conductive contacts of the semiconductor laser with conductive traces on the substrates 155. The attachment system 150 may further be configured to couple the conductive traces on the substrates 155 with conductive portions of the semiconductor substrate. For example, the attachment system 150 may wire bond or apply solder/conductive epoxy to connect the conductive traces on the substrates 155 with corresponding conductive traces on the semiconductor substrate.

The controller 105 may be implemented in any suitable form. In some embodiments, the controller 105 comprises a singular computing device providing centralized control of the construction process. In other embodiments, the controller 105 represents multiple, communicatively coupled computing devices, which may or may not have centralized control. For example, some or all of the actuation system 130, the etch system 135, the deposition system 140, the alignment system 145, and the attachment system 150 may comprise local controllers that are in communication with the controller 105 via the network 125. In an alternate embodiment, the operation of the actuation system 130, the etch system 135, the deposition system 140, the alignment system 145, and the attachment system 150 may be achieved independently of centralized control.

Further, while the system 100 described primarily in terms of manipulating the substrates 155, the various systems described herein may interact with other components as part of constructing the optical apparatus. For example, the actuation system 130 may be configured to manipulate the plurality of optical fibers, the semiconductor laser, and other electrical and/or optical components.

Figure 2:
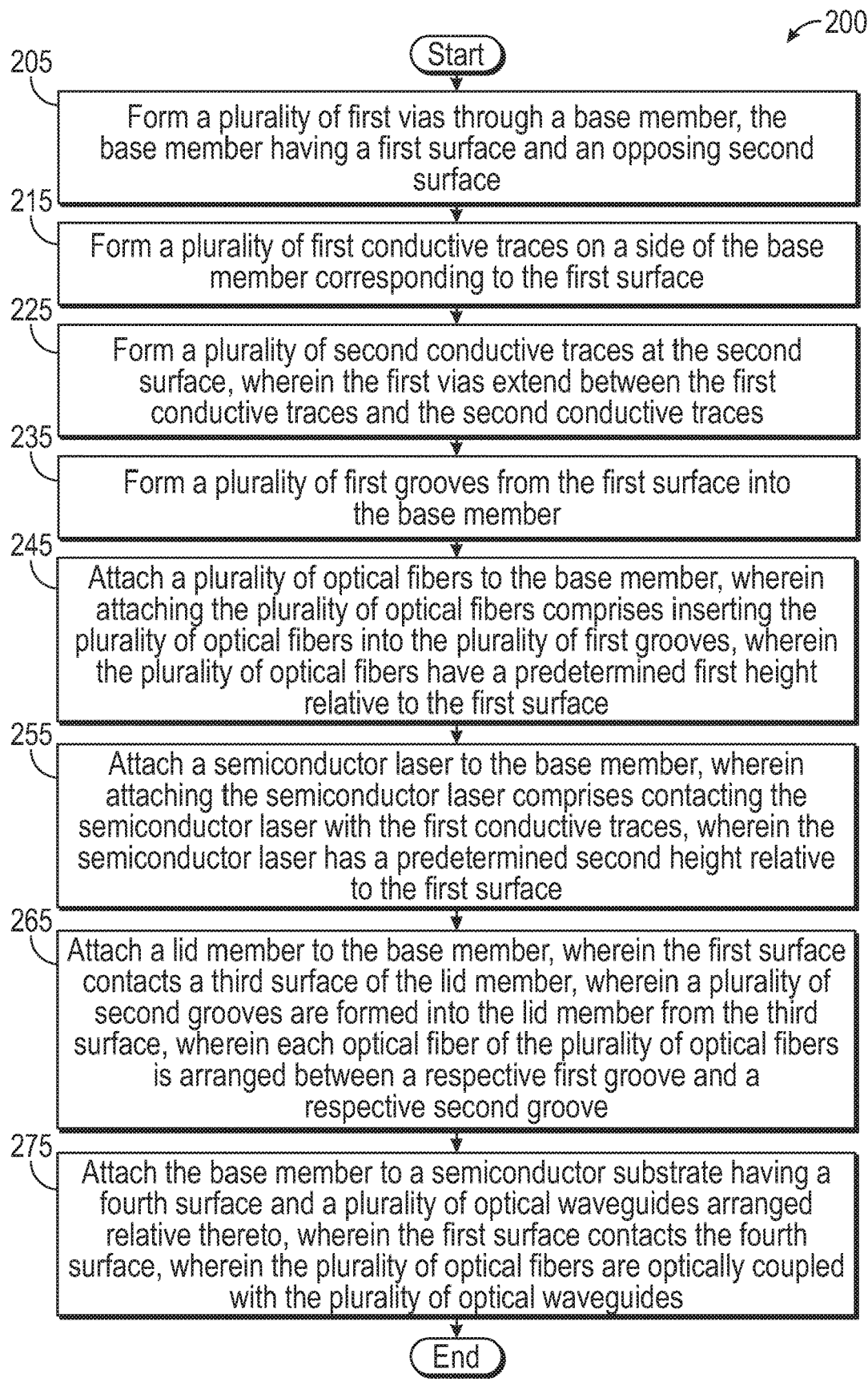
FIG. 2 is an exemplary method of constructing an optical apparatus, according to one or more embodiments.

FIG. 2 is an exemplary method 200 of constructing an optical apparatus, according to one or more embodiments. The method 200 may be used in conjunction with other embodiments described herein. In one embodiment, the method 200 may be performed using a controller 105 of the system 100.

Method 200 begins at block 205, where a plurality of first vias is formed through a base member having a first surface and an opposing second surface. In some embodiments, the base member comprises a first substrate, such as a glass substrate or a semiconductor substrate. In some embodiments, the controller 105 provides control signals to at least an etch system and a deposition system to form the first vias.

At block 215, a plurality of first conductive traces is formed on a side of the base member corresponding to the first surface. In some embodiments, the first conductive traces are formed at the first surface. In other embodiments, the first conductive traces are formed at a surface recessed from the first surface. At block 225, a plurality of second conductive traces is formed at the second surface. The first vias extend between the first conductive traces and the second conductive traces.

At block 235, a plurality of first grooves is formed from the first surface into the base member. In some embodiments, the controller 105 provides control signals to the etch system or another machining system to form the first grooves. At block 245, a plurality of optical fibers is attached to the base member. Attaching the plurality of optical fibers comprises inserting the plurality of optical fibers into the plurality of first grooves. When inserted, the plurality of optical fibers has a predetermined first height relative to the first surface of the base member.

At block 255, a semiconductor laser is attached to the base member. Attaching the semiconductor laser comprises contacting the semiconductor laser with the first conductive traces. The semiconductor laser has a predetermined second height relative to the first surface.

At block 265, a lid member is attached to the base member. In some embodiments, the lid member comprises a second substrate, such as a glass substrate or a semiconductor substrate. A plurality of second grooves is formed into the lid member from a third surface. Each optical fiber of the plurality of optical fibers is arranged between a respective first groove and a respective second groove.

At block 275, the base member is attached to a semiconductor substrate having a fourth surface and a plurality of optical waveguides arranged relative thereto. The first surface of the base member contacts the fourth surface. The plurality of optical fibers (and optionally the semiconductor laser) is optically coupled with the plurality of optical waveguides. The method 200 ends following completion of block 275.

Although the blocks 205-275 are described in a particular order in FIG. 2, alternate embodiments may have one or more of the blocks performed with a different ordering. In one non-limiting example, the plurality of optical fibers is attached to the base member (block 245) after the semiconductor laser is attached to the base member (block 255) and before the lid member is attached to the base member (block 265). Depending on the design of the optical apparatus, it may be easier to attach the semiconductor laser before the relatively long optical fibers are attached.

Figure 9A:
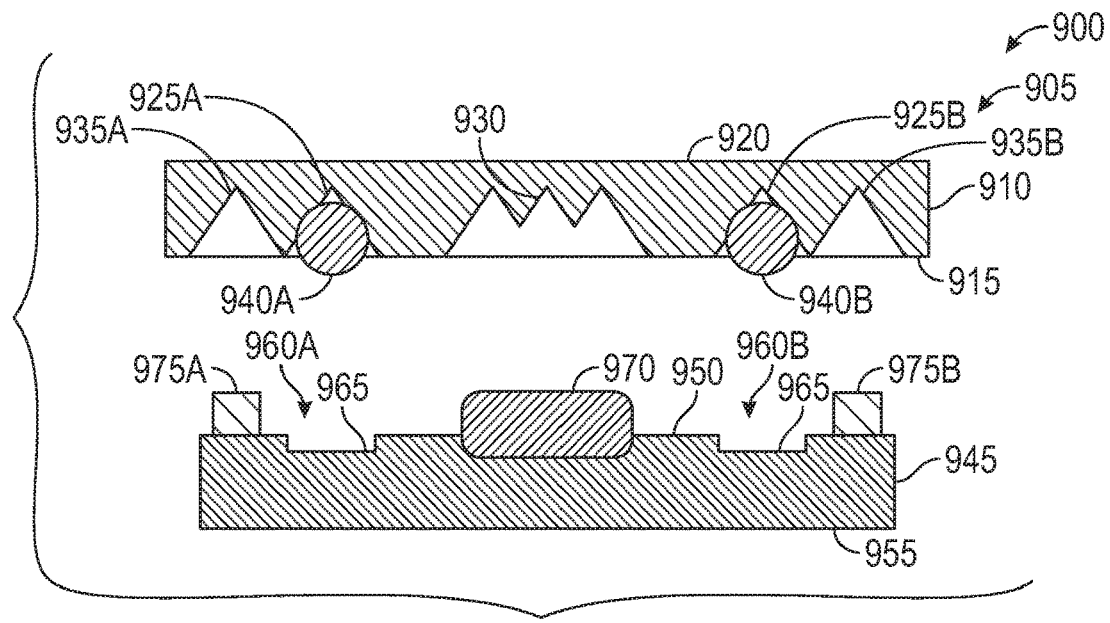
FIGS. 9A-9C are views of an exemplary submount assembly having mechanical alignment features, according to one or more embodiments.

In another non-limiting example (e.g., as depicted in FIG. 9A), the semiconductor laser is attached to the base member (block 255) and the plurality of optical fibers is attached to grooves formed in the lid member. In this example, the method 200 may comprise an additional block in which the grooves are formed in the lid member and the optical fibers are attached to the lid member instead of the base member.

In another non-limiting example, and depending on the design of the semiconductor laser, attaching the semiconductor laser (block 255) may be performed to the end of the method 200 (e.g., after block 275). Beneficially, since the semiconductor lasers are relatively expensive components, performing the attachment of the semiconductor laser later in the method 200 may reduce costs of the optical apparatus due to yield loss.

According to various embodiments, an optical apparatus comprises a semiconductor substrate having a plurality of optical waveguides, and a submount assembly that is shared by a semiconductor laser and a plurality of optical fibers. The submount assembly comprises a substrate, and the optical fibers are inserted into grooves formed into a surface of the substrate. The semiconductor laser is contacted with first conductive traces of the substrate. By controlling the heights of the optical fibers and the semiconductor laser relative to the surface of the substrate, a less complex and/or less costly alignment process of the submount with the semiconductor substrate can be achieved.

Figure 3A:
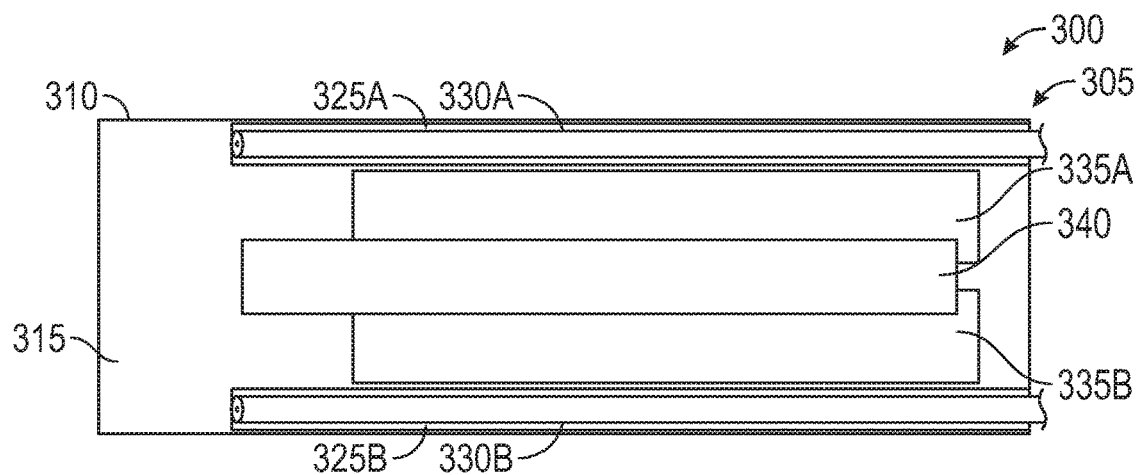
FIGS. 3A-3C are views of an exemplary submount assembly, according to one or more embodiments.
Figure 3B:
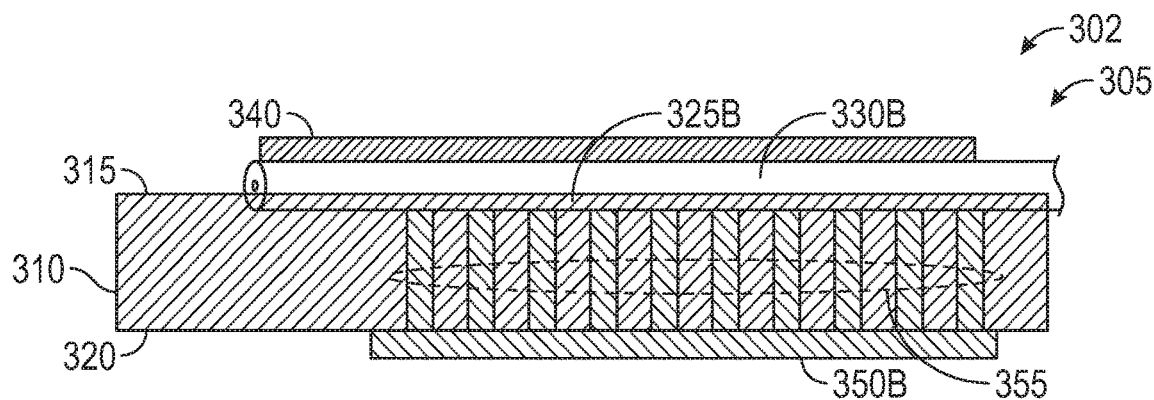
Figure 3C:
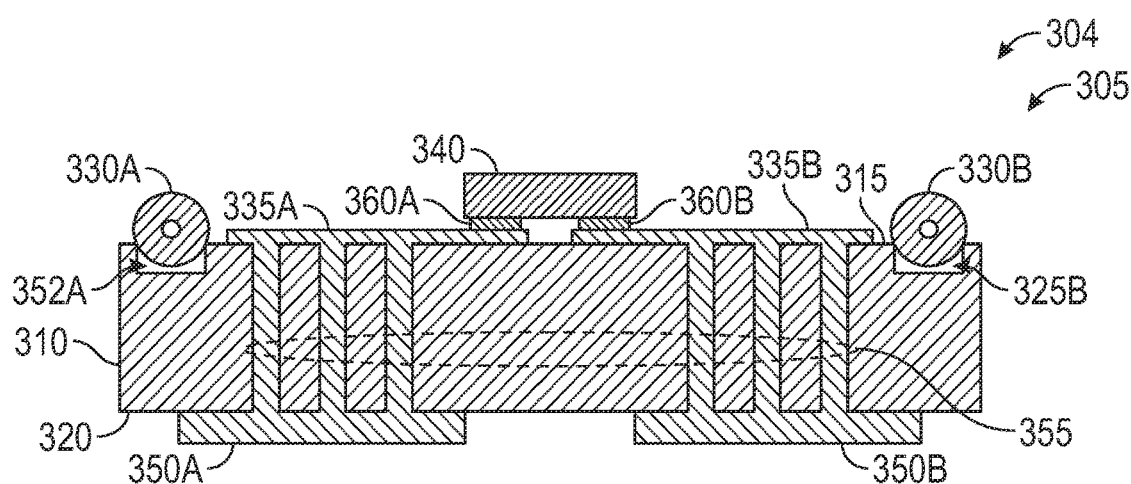

FIGS. 3A-3C are views 300, 302, 304 of an exemplary submount assembly 305, according to one or more embodiments. More specifically, the view 300 represents a top view, the view 302 represents a front view, and the view 304 represents an end view of the submount assembly 305. Features of the submount assembly 305 may be used in conjunction with other embodiments described herein, such as being constructed as part of the method 200 of FIG. 2.

The submount assembly 305 comprises a substrate 310. The substrate 310 may represent a base member of the submount assembly 305, and in some embodiments a lid member may attach to the base member. The substrate 310 may be formed of any suitable material. In some embodiments, the substrate 310 is made of a material that is transmissive of UV light, which beneficially allows easier curing of an epoxy to thereby adhere the substrate 310 with various components. In some embodiments, the substrate 310 comprises a glass substrate. The glass substrate may be laser-patternable; that is, when a laser is focused into the glass substrate, the glass is modified to either locally modify the index of refraction of the glass or to increase an etching rate prior to performing a selective etching process. The glass substrate may have one or more waveguides formed therein using any suitable process, which may include laser patterning. The glass substrate may additionally include one or more mechanical alignment features using any suitable process, which may include laser patterning.

The substrate 310 has a first surface 315 and a second surface 320 opposing the first surface 315. In some embodiments, the first surface 315 and the second surface 320 are parallel planar surfaces; however, other embodiments may include non-parallel and/or non-planar surfaces. The first surface 315 and/or the second surface 320 may serve as reference surfaces for aligning components of the submount assembly 305, and/or aligning components of the submount assembly 305 with one or more external components. A plurality of first grooves 325A, 325B is formed into the substrate 310 from the first surface 315. Each first groove 325A, 325B is dimensioned to receive a portion of a respective optical fiber 330A, 330B of a plurality of optical fibers. In some embodiments, a width of the first groove 325A, 325B is less than a diameter of the corresponding optical fiber 330A, 330B. In some embodiments, the optical fiber 330A, 330B seats against a recessed surface of the corresponding first groove 325A, 325B. The first grooves 325A, 325B may have any suitable profile for accommodating the circumferential edges of the optical fibers 330A, 330B. In some embodiments, and as shown in view 304, the first grooves 325A, 325B are substantially U-shaped. In other embodiments, the first grooves 325A, 325B are substantially V-shaped.

By inserting the optical fibers 330A, 330B into the first grooves 325A, 325B, the optical fibers 330A, 330B (and more specifically, the cores of the optical fibers 330A, 330B capable of carrying optical signals therealong) are arranged with a predetermined first height relative to the first surface 315. In some embodiments, the optical fibers 330A, 330B have a same first height. In other embodiments, the optical fibers 330A, 330B may have different first heights.

A plurality of first conductive traces 335A, 335B is arranged on a side of the substrate 310 corresponding to the first surface 315. The first conductive traces 335A may have any suitable dimensioning. In some embodiments, the first conductive traces 335A, 335B are arranged at the first surface 315. In other embodiments, the first conductive traces 335A, 335B are offset from the first surface 315, such as at a recessed surface.

A semiconductor laser 340 is contacted with the first conductive traces 335A, 335B. The semiconductor laser 340 may have any suitable implementation, such as a laser diode or an optically pumped semiconductor laser. The semiconductor laser 340 may be formed of any suitable semiconductor material, which may include elemental semiconductors (such as silicon) or compound semiconductors (such as group III-V semiconductor materials). Some non-limiting examples include gallium arsenide (GaAs), aluminum gallium arsenide (AlGaAs), gallium phosphide (GaP), indium gallium phosphide (InGaP), gallium nitride (GaN), indium gallium arsenide (InGaAs), indium gallium arsenide nitride (GaInNAs), indium phosphide (InP), gallium indium phosphide (GaInP), and so forth.

In some embodiments, the material of the substrate 310 is selected to have a thermal expansion coefficient similar to that of the semiconductor laser 340. The material of the substrate 310 may further be selected to have good thermal conductivity, as well as the ability to have conductive vias formed therethrough.

As shown, the semiconductor laser 340 is contacted through bonding pads 360A, 360B to the first conductive traces 335A, 335B. When contacted, the semiconductor laser 340 has a predetermined second height relative to the first surface 315. In some embodiments, the height of the semiconductor laser 340 is controlled by controlling the height of the conductive epoxy adhesive used for bonding. Alternatively, fill such as glass or metal beads having a known diameter may be used to help ensure the epoxy adhesive has a desired thickness.

In one embodiment, a AuSn solder process is used to contact the semiconductor laser 340 with the first conductive traces 335A, 335B. The semiconductor laser 340 may have Au contacts and the first conductive traces 335A, 335B are also Au, with a patterned-deposited AuSn solder. The solder is a eutectic material which melts at a much lower temperature than the Au. The electrical connection is formed during the bonding and is frozen into place when the melted solder solidifies. In order to match a consistent distance from the output of the semiconductor laser 340 to the surface of the solder, unmetalized mechanical reference planes may be added that match the semiconductor laser 340 and the substrate 310 such that the distance between the optical output is very consistent with the mechanical features of the substrate 310 which hold the optical fibers 330A, 330B (e.g., a<1 um variation).

In this way, the first height of the optical fibers 330A, 330B and the second height of the semiconductor laser 340 are controlled, which enables a less complex process for optically aligning the submount assembly 305 with a semiconductor substrate. In some embodiments, the first height and the second height are such that the optical fibers 330A, 330B and the semiconductor laser 340 are optically colinear (e.g., from an end view such as view 304). In such cases, the optical fibers 330A, 330B and the semiconductor laser 340 may be optically coupled with a plurality of optically colinear waveguides of the semiconductor substrate. In other embodiments, the optical fibers 330A, 330B and the semiconductor laser 340 are in another, non-colinear arrangement.

A plurality of second conductive traces 350A, 350B is arranged at the second surface 320. A plurality of vias 355 extends through the substrate 310 from the first conductive traces 335A, 335B to the second conductive traces 350A, 350B. In some embodiments, the substrate 310 comprises a glass substrate and the plurality of vias 355 may be formed using laser patterning of the glass substrate. As shown, the first conductive trace 335A is coupled with the second conductive trace 350A via a first plurality of the vias 355. The second conductive trace 335B is coupled with the second conductive trace 350B via a second plurality of the vias 355. In this way, the second conductive traces 350A, 350B at the second surface 320 are communicatively coupled with the semiconductor laser 340.

In some embodiments, the submount assembly 305 is placed in an inverted configuration when contacting the first surface 315 to the semiconductor substrate. An example of the inverted configuration is illustrated in FIG. 4C and is discussed below. Through the coupling with the second conductive traces 350A, 350B, the connectivity with the semiconductor laser 340 remains accessible when the submount assembly 305 is in the inverted configuration.

As shown in the views 300, 302, 304, the semiconductor laser 340 is arranged between the optical fibers 330A, 330B. Each of the optical fibers 330A, 330B and the semiconductor laser 340 extend along respective longitudinal axes that are parallel to each other. However, other embodiments may have different arrangements of the semiconductor laser 340 relative to the optical fibers 330A, 330B, as well as different arrangements of the optical fibers 330A, 330B relative to each other. Further, alternate embodiments of the submount assembly 305 may include different numbers of optical fibers and/or semiconductor lasers.

Figure 4A:
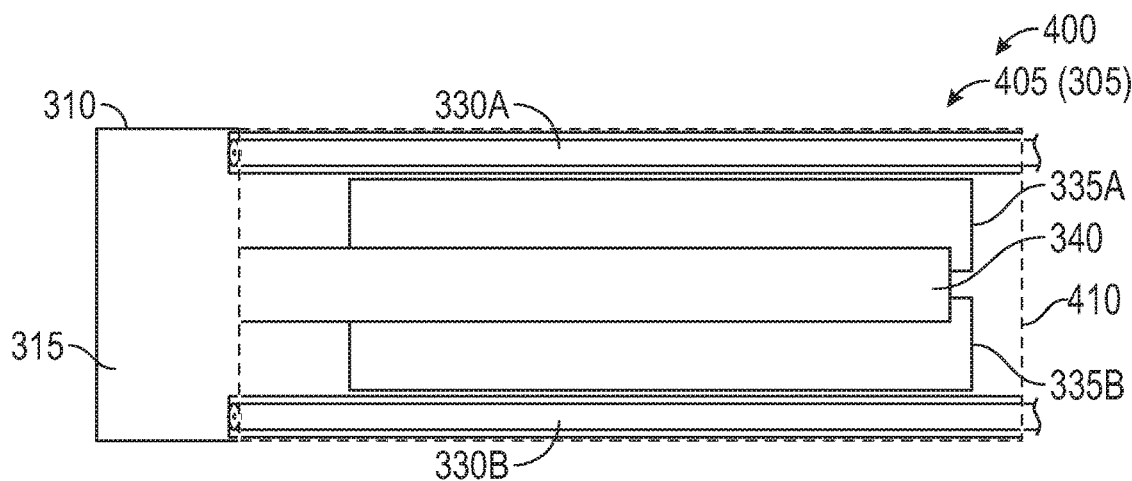
FIGS. 4A-4C are views of an exemplary submount assembly, according to one or more embodiments.
Figure 4B:
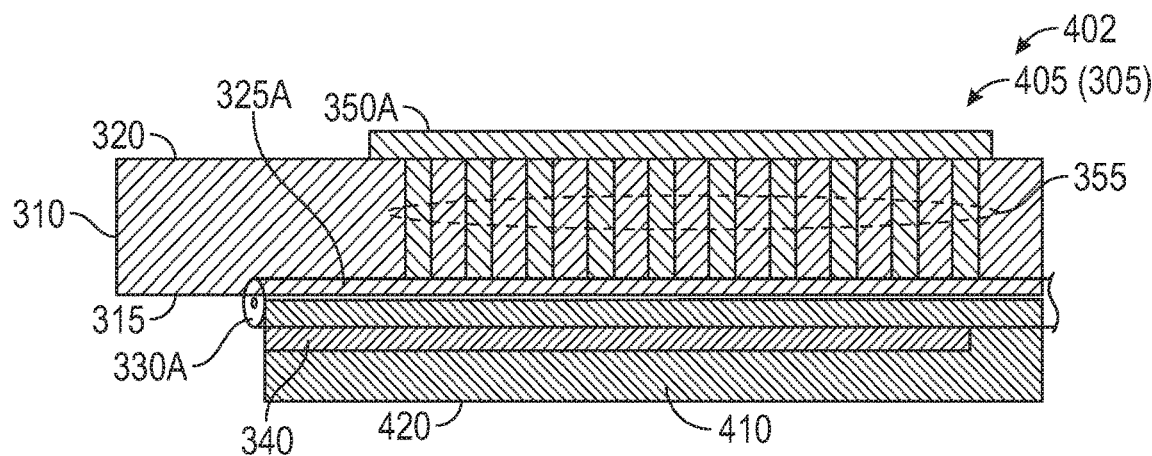
Figure 4C:
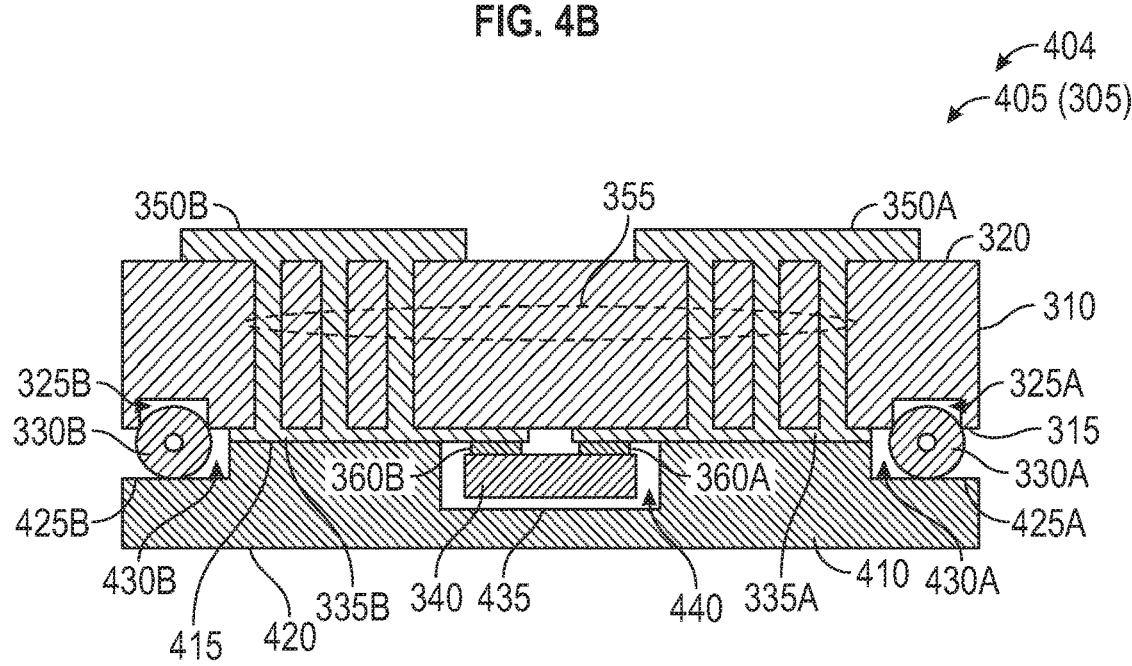

Next, FIGS. 4A-4C are views 400, 402, 404 of an exemplary submount assembly 405, according to one or more embodiments. More specifically, the view 400 is a top view, the view 402 is a front view, and the view 404 is a side view of the submount assembly 405. Features of the submount assembly 405 may be used in conjunction with other embodiments, e.g., part of the optical apparatus 505 of FIG. 5.

The submount assembly 405 includes the submount assembly 305 attached to a substrate 410. In some cases, the substrate 410 represents a lid member that attaches to the base member. The substrate 410 may be formed of any suitable material. In some embodiments, the substrate 410 is made of an elemental or compound semiconductor material. In other embodiments, the substrate 410 is made of a material is transmissive of UV light, such as a glass substrate. The substrate 410 has a first surface 415 opposing a second surface 420. In some embodiments, the first surface 415 and the second surface 420 are parallel planar surfaces; however, other embodiments may include non-parallel and/or non-planar surfaces.

In some embodiments, recesses 430A, 430B are formed from the first surface 415 to recessed surfaces 425A, 425B. The recesses 430A, 430B and/or the recessed surfaces 425A, 425B may have the same dimensioning, but this is not a requirement. In some embodiments, the optical fibers 330A, 330B are partly or completely received into the first grooves 325A, 325B, and are also partly received in the recesses 430A, 430B. In some embodiments, adhesive such as epoxy may be applied to the recesses 430A, 430B to adhere the optical fibers 330, 330B and/or the substrate 310 to the substrate 410.

In some embodiments, a recess 440 is formed from the first surface 415 to a recessed surface 435. The recess 440 is dimensioned to receive the semiconductor laser 340 therein. In some embodiments, when the first surface 315 of the substrate 310 is contacted with the first surface 415 of the substrate 410, the semiconductor laser 340 is received in the recess 440.

Figure 5A:
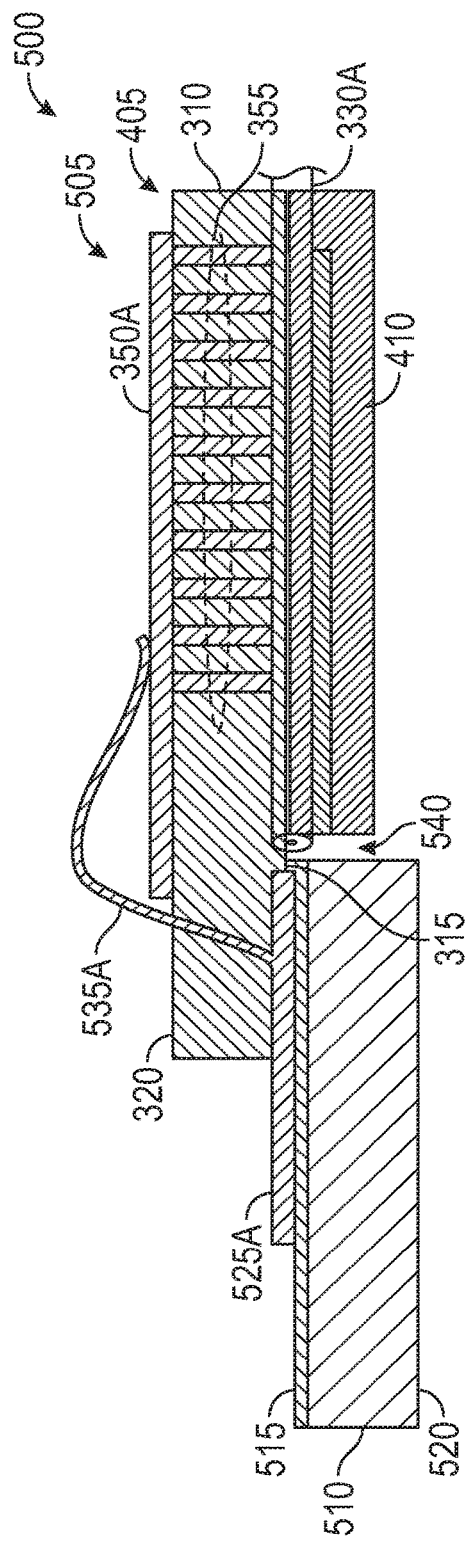
FIGS. 5A and 5B are views of an exemplary optical apparatus, according to one or more embodiments.
Figure 5B:
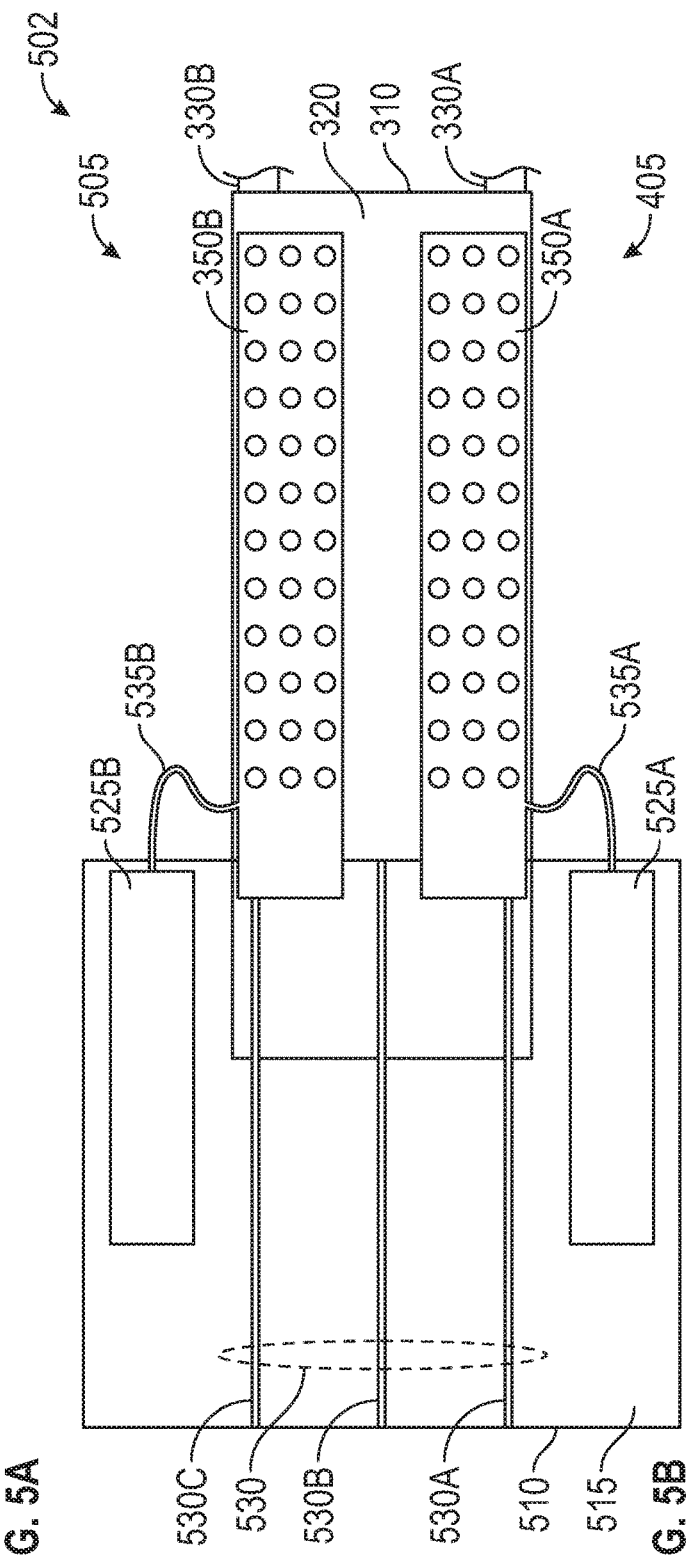

FIGS. 5A and 5B are views 500, 502 of an exemplary optical apparatus 505, according to one or more embodiments. More specifically, the view 500 is a front view and the view 502 is a top view of the optical apparatus 505. The optical apparatus 505 includes the submount assembly 405 attached to a semiconductor substrate 510. Features of the optical apparatus 505 may be used in conjunction with other embodiments, such as being constructed as part of the method 200 of FIG. 2.

The substrate 510 may be formed of any suitable material. In some embodiments, the substrate 510 comprises a silicon substrate. The semiconductor substrate 510 has a first surface 515 opposing a second surface 520. In some embodiments, the first surface 515 and the second surface 520 are parallel planar surfaces; however, other embodiments may include non-parallel and/or non-planar surfaces.

The substrate 510 has a plurality of optical waveguides 530 arranged with a predetermined height relative to the first surface 515. Because the heights of the various components are controlled relative to the first surface 515, the optical fiber 330A may have a same height as a first optical waveguide 530A, the semiconductor laser 340 may have a same height as a second optical waveguide 530B, and the optical fiber 330B may have a same height as a third optical waveguide 530C when the first surface 315 of the substrate 310 is contacted with the first surface 515 of the substrate 510. In some cases, additional alignment is performed to optically align the optical fibers 330A, 330B and the semiconductor laser 340 with the respective optical waveguides 530A, 530B, 530C. However, due to the matching arrangements of the plurality of optical waveguides 530 with the optical fibers 330A, 330B and the semiconductor laser 340.

As shown, each of the optical waveguides 530A, 530B, 530C extend to an end of the substrate 510 that is separated from the optical fibers 330A, 330B and the semiconductor laser 340 by an air gap 540. In some embodiments, a portion of the air gap 540 between the optical waveguides 530A, 530C and the optical fibers 330A, 330B may be filled by an index matching epoxy.

The substrate 510 has conductive traces 525A, 525B at the first surface 515. The second conductive traces 350A, 350B are communicatively coupled with the conductive traces 525A, 525B via respective bond wires 535A, 535B.

Figure 6A:
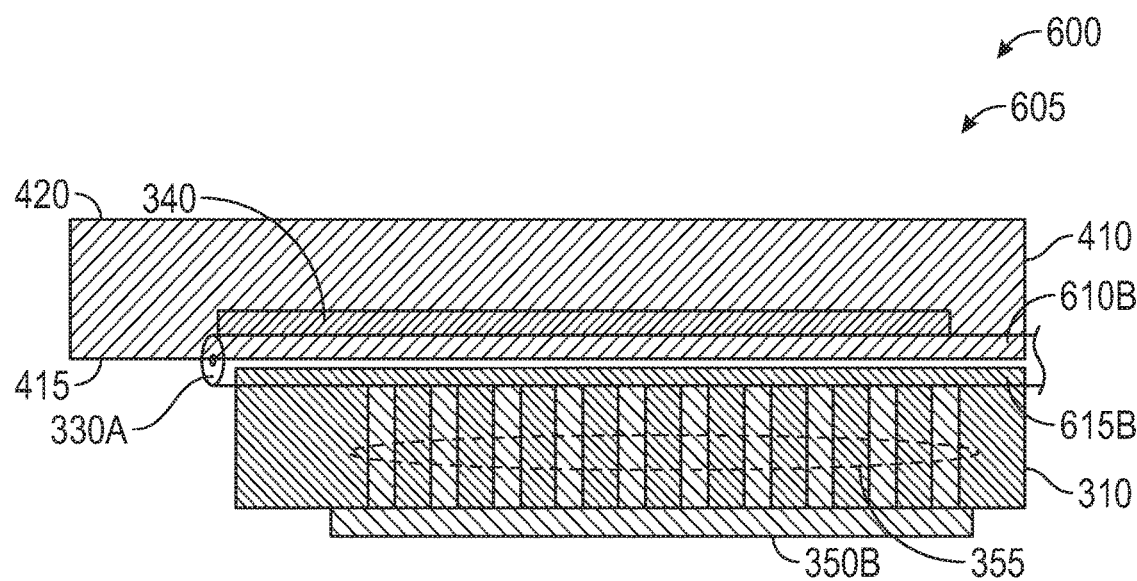
FIGS. 6A and 6B are views of an exemplary submount assembly having grooves formed in a lid member, according to one or more embodiments.
Figure 6B:
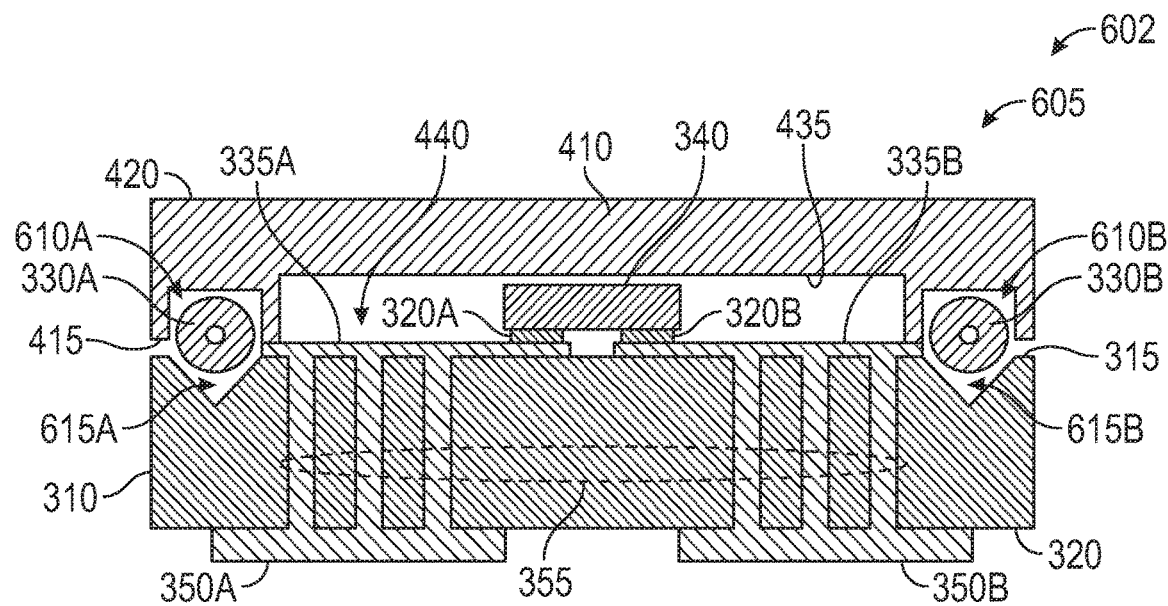

FIGS. 6A and 6B are views 600, 602 of an exemplary submount assembly 605 having grooves formed in a lid member, according to one or more embodiments. More specifically, the view 600 is a front view and the view 602 is an end view of the submount assembly 605. Features of the submount assembly 605 may be used in conjunction with other embodiments, e.g., part of the optical apparatus 505 of FIG. 5.

The submount assembly 605 includes the substrate 410 attached to the substrate 310. A plurality of grooves 610A, 610B is formed into the substrate 410 (or base member) from the first surface 415, and a plurality of grooves 615A, 615B are formed into the substrate 310 (or lid member) from the first surface 315. Thus, when the first surface 415 is contacted with the first surface 315, the optical fiber 330A is arranged between the grooves 610A, 615A, and the optical fiber 330B is arranged between the grooves 610B, 615B. Stated another way, the optical fiber 330A is arranged at a particular height relative to the first surface 315 due to its contact with the grooves 610A, 615A, and the optical fiber 330B is arranged at a particular height due to its contact with the grooves 610B, 615B.

Figure 7A:
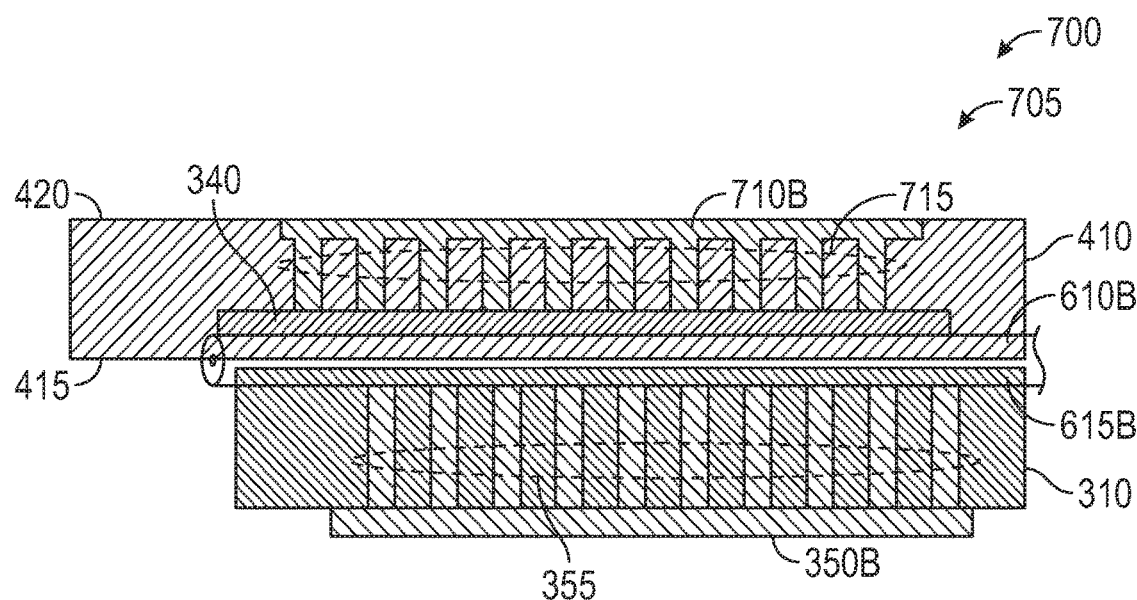
FIGS. 7A and 7B are views of an exemplary submount assembly having grooves and vias formed in a lid member, according to one or more embodiments.
Figure 7B:
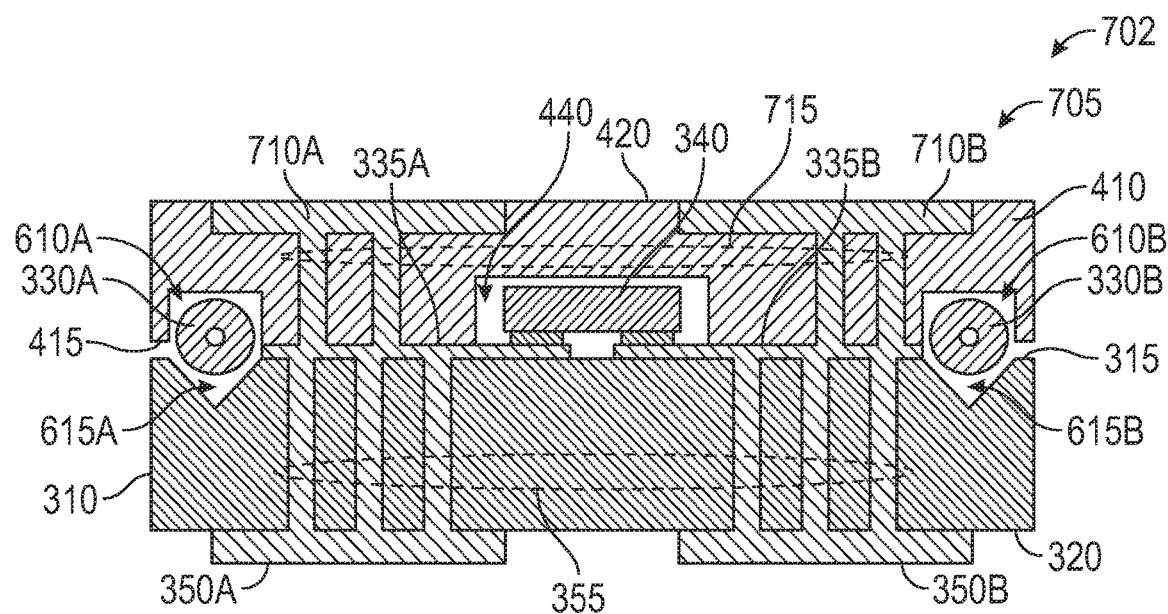

FIGS. 7A and 7B are views 700, 702 of an exemplary submount assembly 705 having grooves and vias formed in a lid member, according to one or more embodiments. More specifically, the view 700 is a front view and the view 702 is an end view of the submount assembly 705. Features of the submount assembly 705 may be used in conjunction with other embodiments, e.g., part of the optical apparatus 505 of FIG. 5.

A plurality of conductive traces 710A, 710B are formed at the second surface 420 of the substrate 410, and a plurality of vias 715 extend through the substrate 410 to the first surface 415. The conductive traces 710A, 710B are communicatively coupled with the conductive traces 335A, 335B and with the conductive traces 350A, 350B.

Figure 8A:
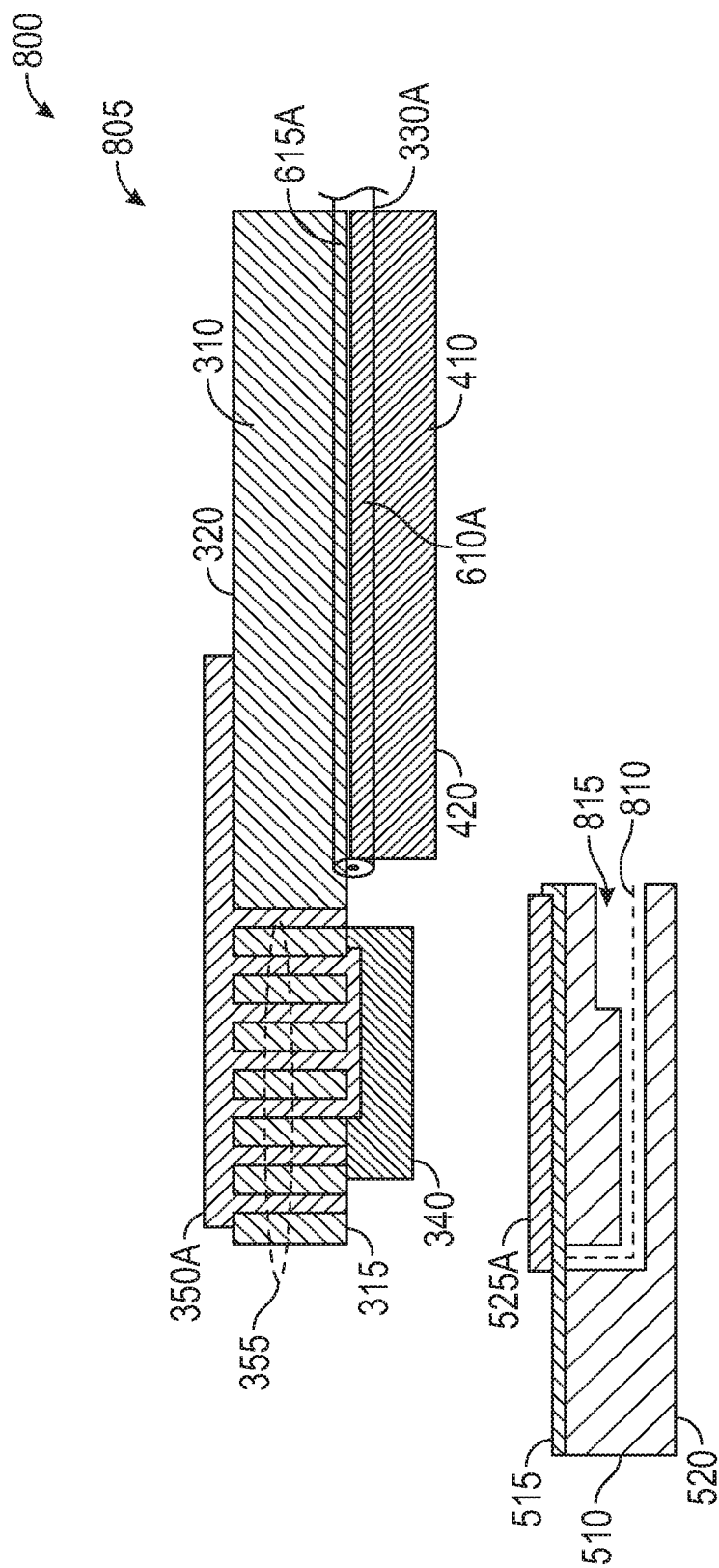
FIGS. 8A and 8B are views of an exemplary optical apparatus having a semiconductor laser arranged in a recess of the semiconductor substrate, according to one or more embodiments.
Figure 8B:
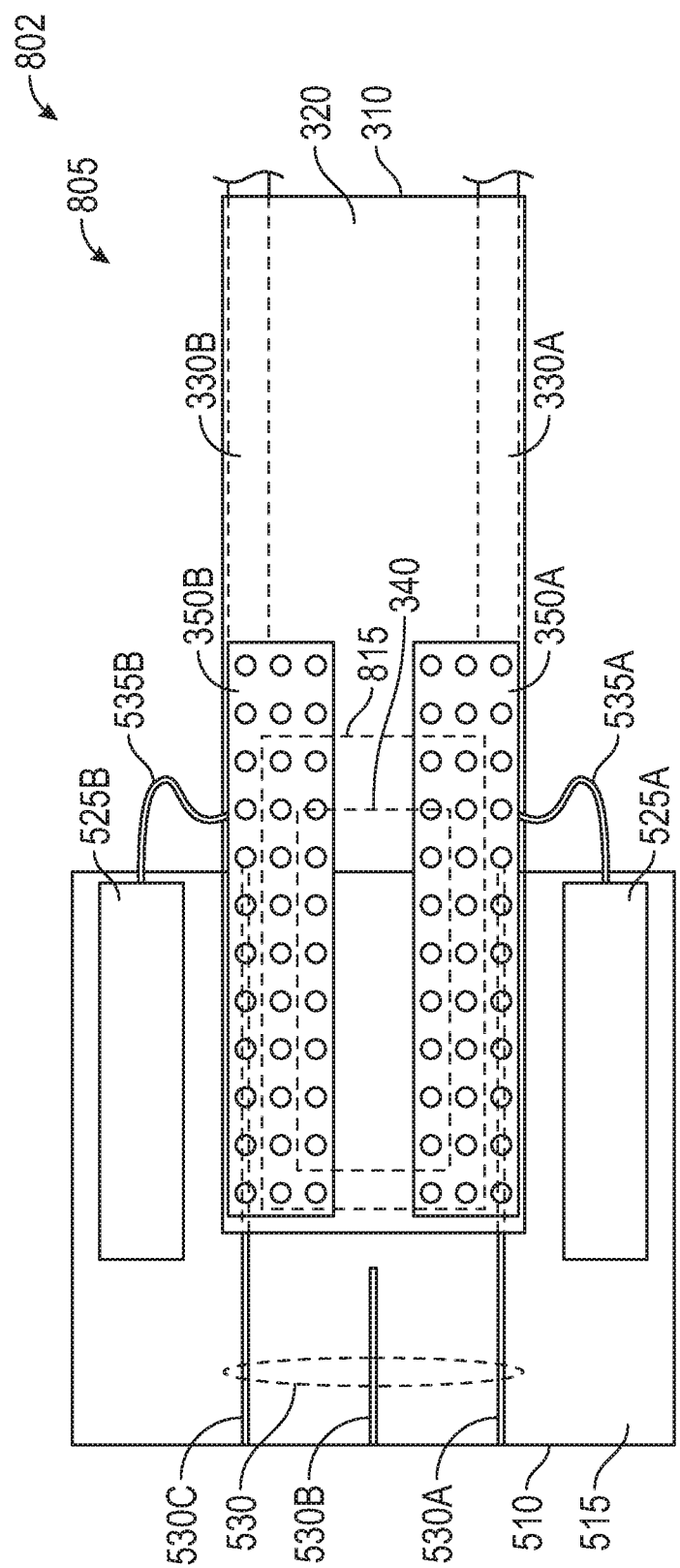

FIGS. 8A and 8B are views 800, 802 of an exemplary optical apparatus 805 having a semiconductor laser 340 arranged in a recess 815 of the semiconductor substrate 510, according to one or more embodiments. More specifically, the view 800 is a side view and the view 802 is a top view of the optical apparatus 805. The optical apparatus 805 may be used in conjunction with other embodiments, such as being constructed as part of the method 200 of FIG. 2.

The recess 815 extends from the first surface 515 of the substrate 510 to a recessed surface 810. As shown, the first surface 515 and the recessed surface 810 are parallel planar surfaces; however, other embodiments may include non-parallel and/or non-planar surfaces.

In the optical apparatus 805, the plurality of vias 355 extend through a region of the substrate 310 that is non-overlapping with the substrate 410. The semiconductor laser 340 is non-overlapping with the substrate 410. As shown, the optical waveguides 530A, 530C extend to an end of the substrate 510 that is separated from the optical fibers 330A, 330B. The optical waveguide 530B extends to the recess 815.

In the embodiments depicted in FIGS. 3A-8B, the semiconductor laser and the plurality of optical fibers are attached at a same surface of a single substrate, and another substrate may be attached later. However, it may be beneficial in some cases to attach the semiconductor laser to a different substrate than the plurality of optical fibers. For example, different portions of the submount assembly may be constructed in different stages (e.g., using different facilities and/or different vendors) and the portions are then combined to form the submount assembly.

Figure 9B:
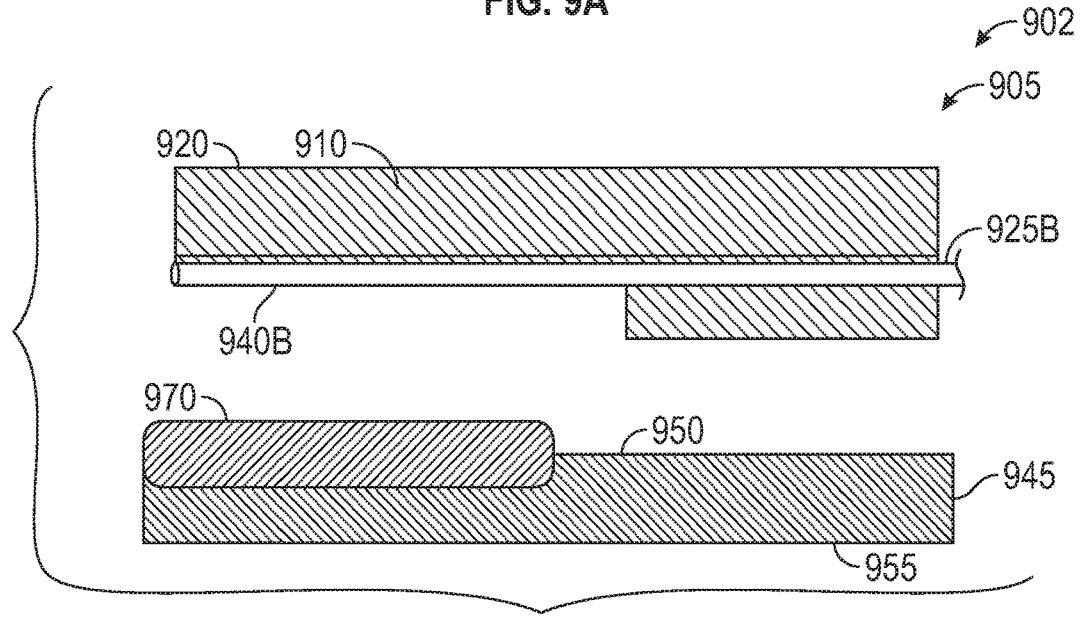
Figure 9C:
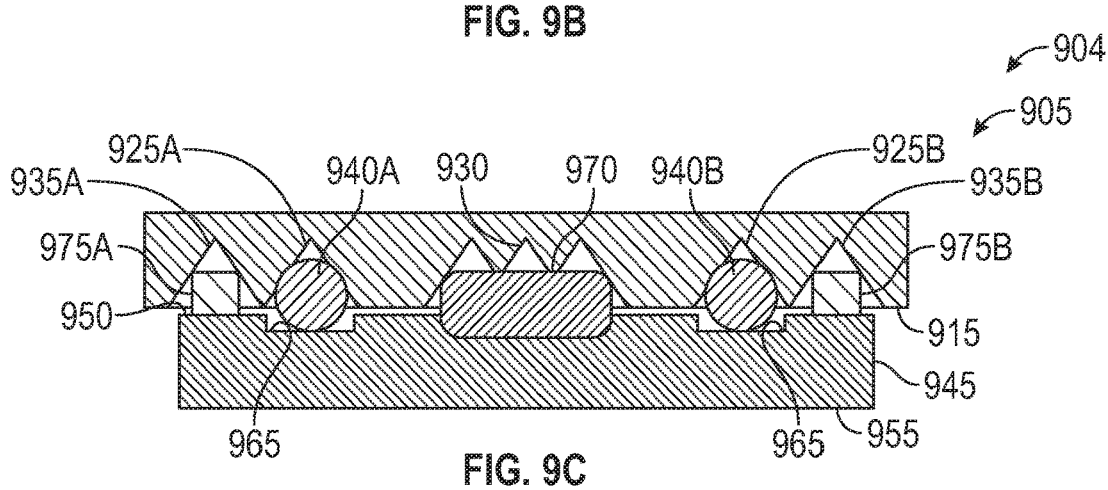

FIGS. 9A-9C are views 900, 902, 904 of an exemplary submount assembly 905 having mechanical alignment features, according to one or more embodiments. More specifically, the view 900 is an end view of portions 906, 908 of the submount assembly 905, the view 902 is a front view of the portions 906, 908, and the view 904 is an end view of the portions 906, 908 when contacted together. Features of the submount assembly 905 may be used in conjunction with other embodiments, e.g., part of the optical apparatus 505 of FIG. 5.

A first portion 906 of the submount assembly 905 comprises a first substrate 910 having a first surface 915 opposing a second surface 920. A plurality of first grooves 925A, 925B, a second groove 930, and a plurality of third grooves 935A, 935B are formed into the first substrate 910 from the first surface 915. While v-shaped grooves are shown, alternate embodiments may include other shapes of grooves. Each of the first grooves 925A, 925B is dimensioned to receive a portion of a respective optical fiber 940A, 940B, and to arrange the optical fibers 940A, 940B with a predetermined height relative to the first surface 915.

The second groove 930 and/or the third grooves 935A, 935B may be dimensioned different from the first grooves 925A, 925B. For example, the second groove 930 may be relatively larger and dimensioned to receive a portion of a semiconductor laser 970. In some embodiments, the second groove 930 is dimensioned to contact the semiconductor laser 970, but this is not a requirement. The third grooves 935A, 935B may have any suitable dimensioning for contacting features 975A, 975B of a second portion 908 of the submount assembly 905. In one alternate embodiment, one or more dummy optical fibers may be used as the features 975A, 975B.

The second portion 908 of the submount assembly 905 comprises a second substrate 945 having a first surface 950 opposing a second surface 955. A plurality of recesses 960A, 960B extend from the first surface 950 to a recessed surface 965. Each recess 960A, 960B is dimensioned to receive a portion of a respective optical fiber 940A, 940B. The features 975A, 975B extend from the first surface 950 and are dimensioned to form one or more points of contact with the third grooves 935A, 935B.

The optical fibers 940A, 940B may be pre-cleaved and/or polished before contacting the first portion 906 and the second portion 908. In some embodiments, the first portion 906 comprises a feature 916 that is received in a recess (not shown) of the substrate 945 when the first portion 906 and the second portion 908 are contacted. In some embodiments, the feature 916 and the recess may be dimensioned to limit the relative motion of the first portion 906 and the second portion 908.

When the first portion 906 and the second portion 908 are contacted, the optical fiber 940A contacts the first groove 925A and the recessed surface 965, and the optical fiber 940B contacts the first groove 925B and the recessed surface 965. The feature 975A contacts the third groove 935A and the feature 975B contacts the third groove 935B. The semiconductor laser 970 may contact one or more features defining the second recess 930, but this is not a requirement. In this way, the optical fibers 940A, 940B and the semiconductor laser 970 have predetermined heights relative to the first surface 950. An epoxy or other adhesive may be applied and cured to adhere the first portion 906 and the second portion 908.

Figure 10A:
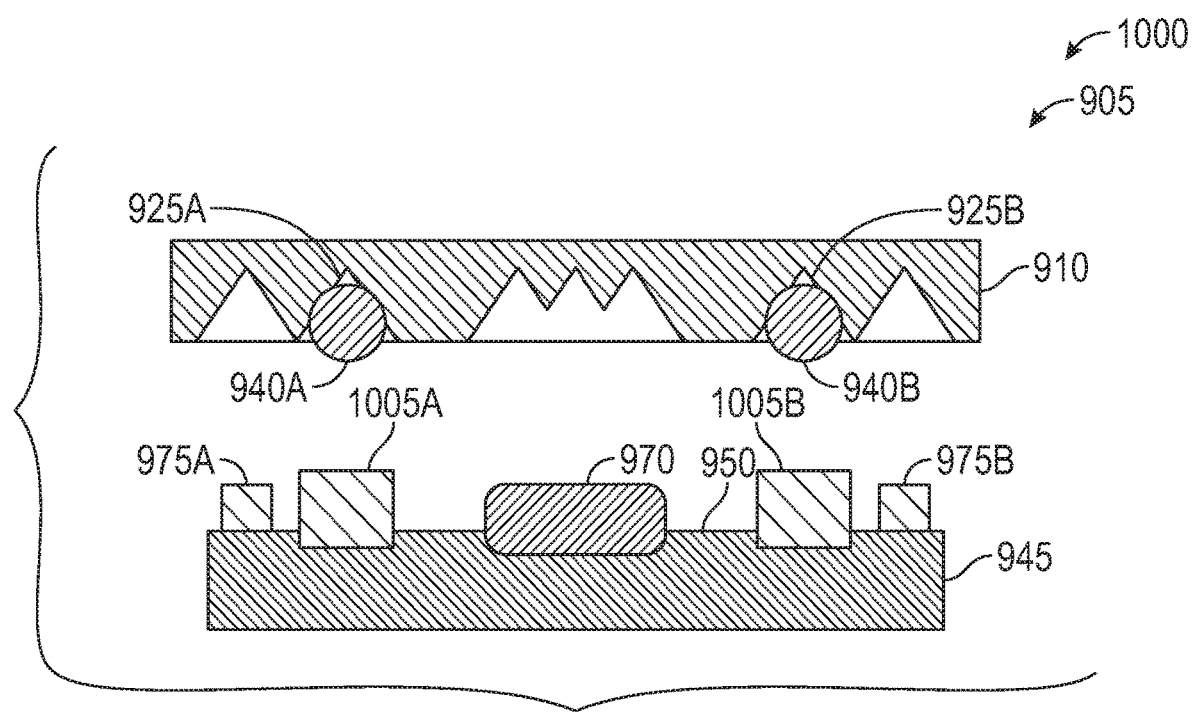
FIGS. 10A and 10B are views of an exemplary submount assembly having mechanical alignment features and spot size converters, according to one or more embodiments.
Figure 10B:
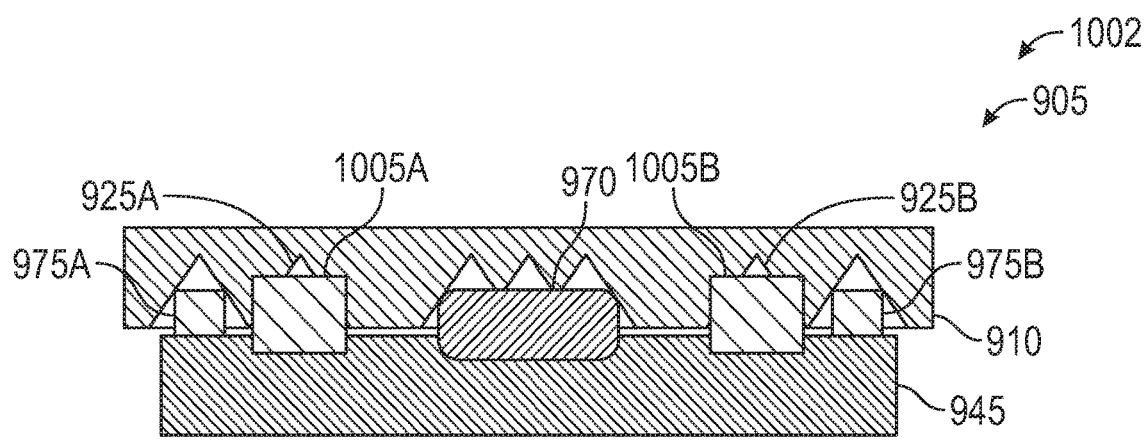

FIGS. 10A and 10B are views 1000, 1002 of the submount assembly 905 having mechanical alignment features and spot size converters, according to one or more embodiments. More specifically, the view 1000 is an end view of the portions 906, 908 of the submount assembly 905, and the view 1002 is an end view of the portions 906, 908 when contacted together. Features of the submount assembly 905 may be used in conjunction with other embodiments, e.g., part of the optical apparatus 505 of FIG. 5.

Notably, the second portion 908 comprises spot size converters 1005A, 1005B that extend from the first surface 950. The spot size converters 1005A, 1005B may have any implementation suitable for increasing a mode size or otherwise adapting the mode of optical signals received from the optical fibers 940A, 940B. When the first portion 906 and the second portion 908 are contacted, the optical fiber 940A contacts the first groove 925A and the recessed surface 965, and the optical fiber 940B contacts the first groove 925B and the recessed surface 965. With these contacting relationships, the optical fiber 940A is optically aligned with the spot size converter 1005A, and the optical fiber 940B is optically aligned with the spot size converter 1005B. An epoxy or other adhesive may be applied and cured to thereby adhere the first portion 906 and the second portion 908. Beneficially, using the spot size converters 1005A, 1005B to optically align with the optical fibers 940A, 940B tolerance control may be improved at the interface between the first portion 906 and the second portion 908.

Figure 11A:
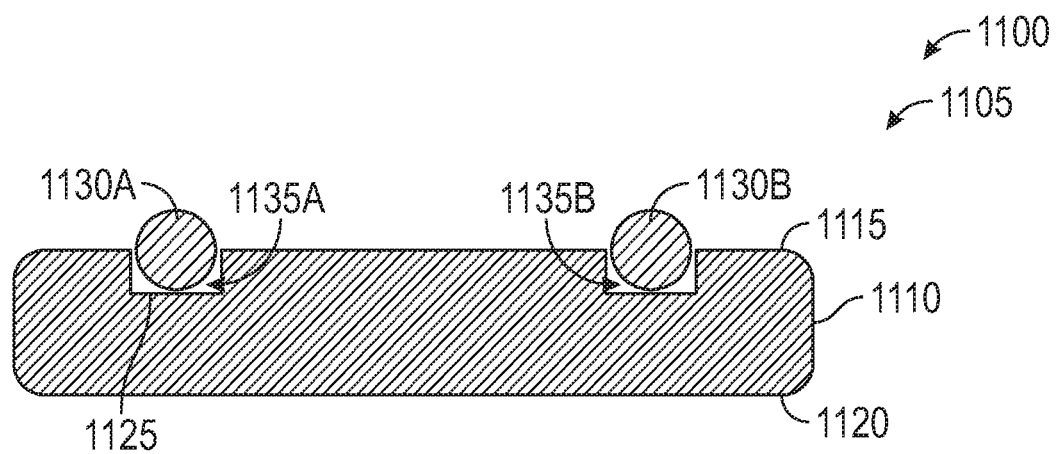
FIGS. 11A and 11B are views of an exemplary submount assembly having grooves formed into a semiconductor laser, according to one or more embodiments.
Figure 11B:
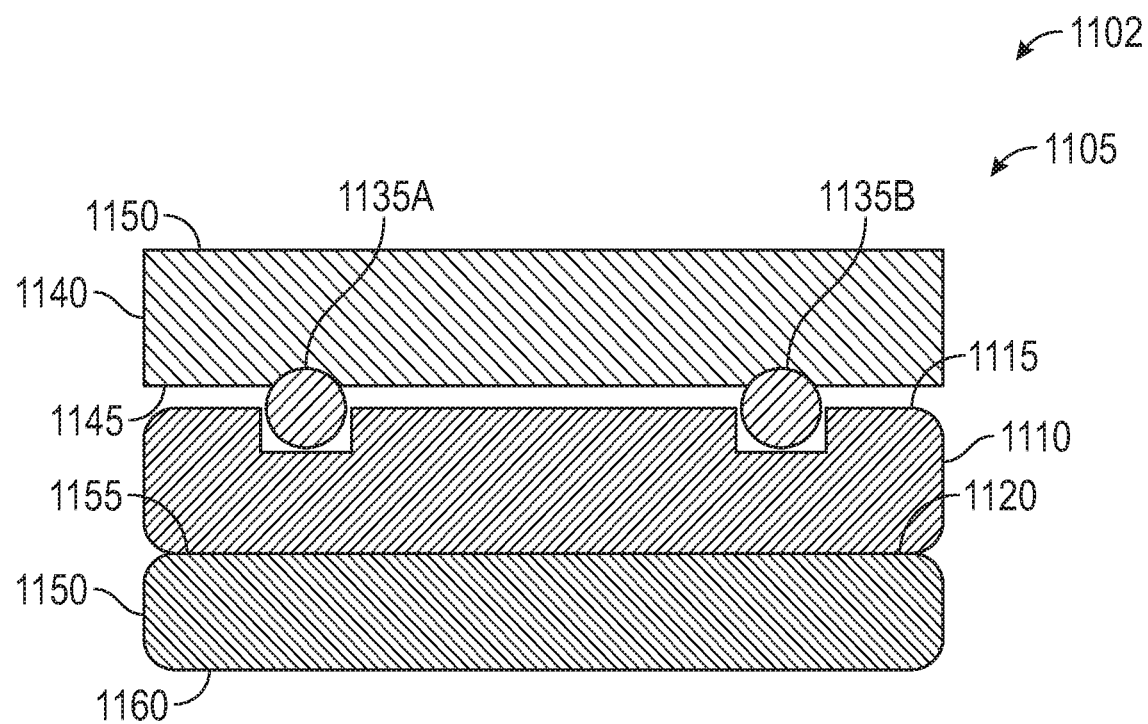

FIGS. 11A and 11B are views 1100, 1102 of an exemplary submount assembly 1105 having grooves formed into a semiconductor laser 1110, according to one or more embodiments. More specifically, the view 1100 is an end view of the semiconductor laser 1110 and a plurality of optical fibers 1130A, 1130B, and the view 1102 is an end view of the submount assembly 1105 once assembled. Features of the submount assembly 1105 may be used in conjunction with other embodiments, e.g., part of the optical apparatus 505 of FIG. 5.

The semiconductor laser 1110 has a first surface 1115 opposing a second surface 1120. In some embodiments, a plurality of grooves 1135A, 1135B extends from the first surface 1115 to a recessed surface 1125. While the grooves 1135A, 1135B are shown as U-shaped grooves, alternate shapes of grooves are also possible. In some embodiments, the grooves 1135A, 1135B are etched with lithographically-defined tolerances during the fabrication of the semiconductor laser 1110. Beneficially, sub-micron tolerances may be achieved when the optical fibers 1130A, 1130B are inserted into the grooves 1135A, 1135B.

The submount assembly 1105 further comprises a lid member 1140, such as a glass substrate. The lid member 1140 has a first surface 1145 opposing a second surface 1150. In some embodiments, the first surface 1145 of the lid member 1140 is contacted with the first surface 1115 of the semiconductor laser 1110. The lid member 1140 may define a plurality of grooves or recesses (not shown) that are dimensioned to partly receive the optical fibers 1130A, 1130B. The lid member 1140 and the semiconductor laser 1110 may be attached together using known techniques.

In some embodiments, the semiconductor laser 1110 is not thinned during fabrication. In this way, the relatively thicker semiconductor laser 1110 mitigates any reduction of tensile strength of the semiconductor laser 1110 introduced by forming the grooves 1135A, 1135B. Additionally or alternatively, the semiconductor laser 1110 may be attached to a mechanical support 1152 for providing additional strength to the submount assembly 1105. As shown, the second surface 1120 is contacted with a first surface 1155 of the mechanical support 1152. In one embodiment, the mechanical support 1152 comprises a silicon substrate, although substrates of other materials are also possible.

Figure 12A:
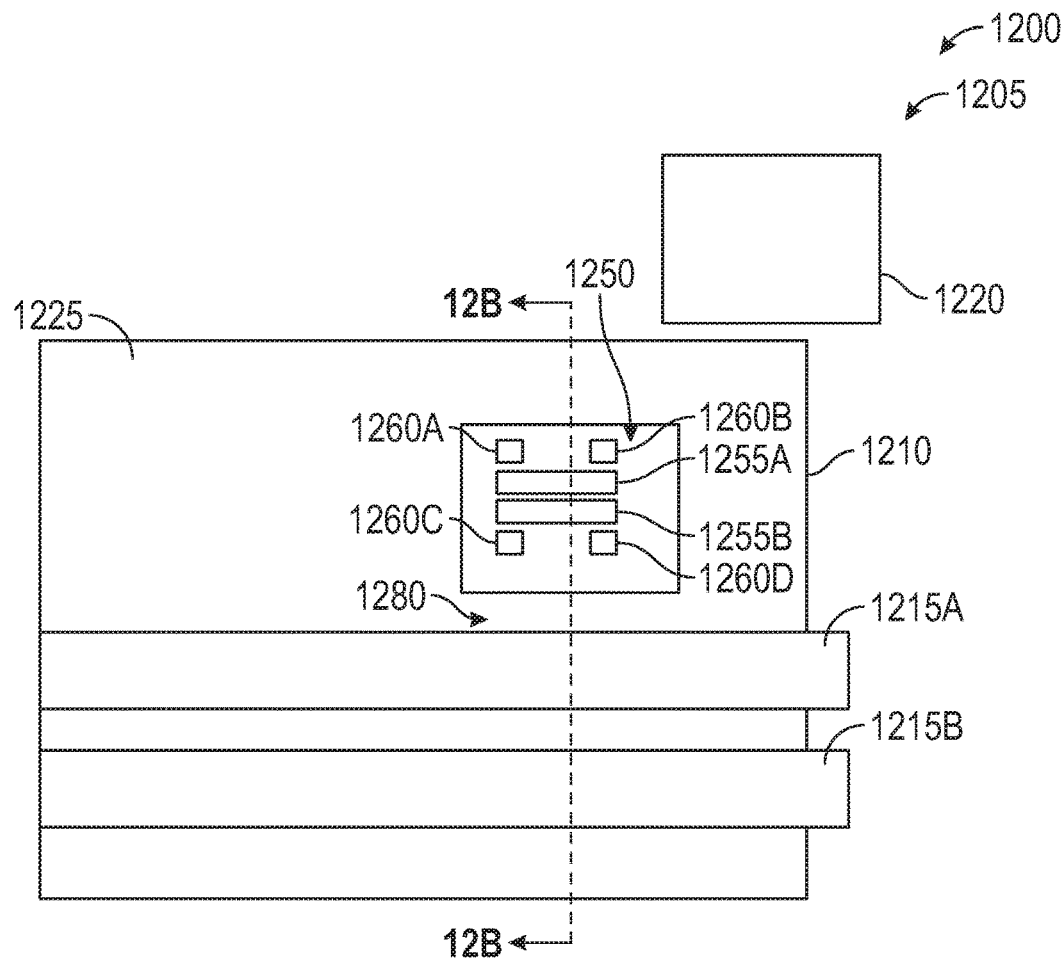
FIGS. 12A and 12B are views of an exemplary submount assembly having mechanical stop features, according to one or more embodiments.
Figure 12B:
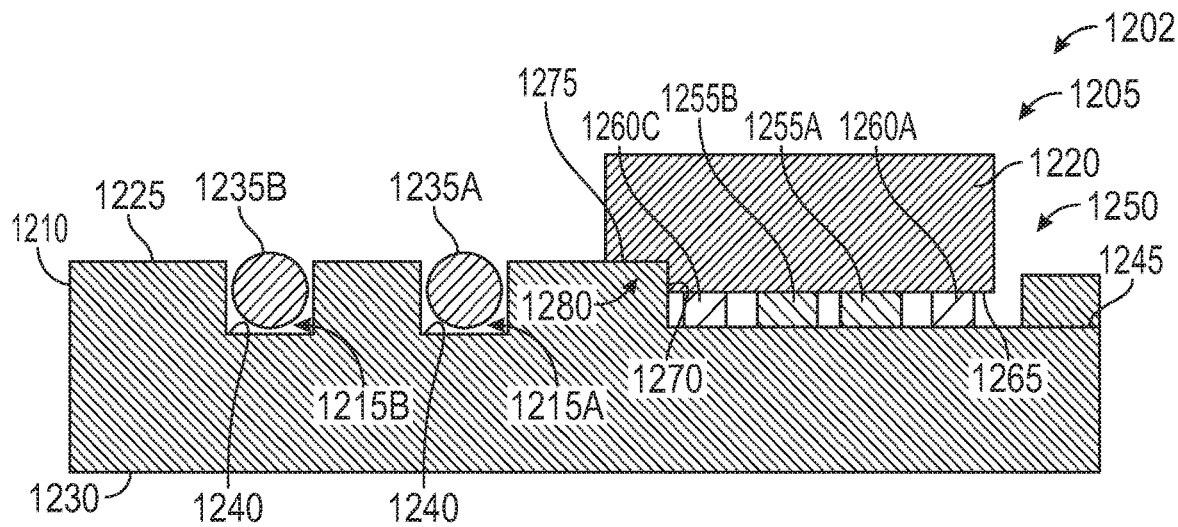

FIGS. 12A and 12B are views 1200, 1202 of an exemplary submount assembly 1205 having mechanical stop features, according to one or more embodiments. More specifically, the view 1200 is a top view and the view 1202 is a cross-section view of the submount assembly 1205 once assembled. The features of the submount assembly 1205 may be used in conjunction with other embodiments, e.g., part of the optical apparatus 505 of FIG. 5.

The submount assembly 1205 comprises a substrate 1210 (or a base member) having a first surface 1225 opposing a second surface 1230. A plurality of grooves 1215A, 1215B is formed from the first surface 1225 to a recessed surface 1240. Each groove 1215A, 1215B receives a respective optical fiber 1235A, 1235B partly therein. A recess 1250 is formed from the first surface 1225 to a recessed surface 1245, which may or may not be at a same height as the recessed surface 1240 relative to the first surface 1225.

Within the recess 1250, a plurality of mechanical stop features 1260A, 1260B, 1260C, 1260D (or pillars) are arranged around a plurality of conductive traces 1255A, 1255B, and extend orthogonally from the recessed surface 1245. In some embodiments, a first surface 1265 of the semiconductor laser 1220 is configured to contact the mechanical stop features 1260A, 1260B, 1260C, 1260D to limit the movement of the semiconductor laser 1220 in a first dimension. In some embodiments, solder may be applied to the mechanical stop features 1260A, 1260B, 1260C, 1260D, which urges the semiconductor laser 1220 toward the substrate 1210.

In some embodiments, one or more sidewalls of the substrate 1210 surrounding the recess 1250 may act as a mechanical stop feature 1280 for the semiconductor laser 1220. The sidewalls may be anisotropically etched to form substantially vertical sidewalls. In some embodiments, the semiconductor laser 1220 may have a complementary feature for contacting the mechanical stop feature 1280. As shown, the semiconductor laser 1220 comprises a mesa feature 1270 that extends from a first surface 1265 to a recessed surface 1275. In some embodiments, the mesa feature 1270 may be etched into the semiconductor laser 1220. Contacting the mesa feature 1270 with the mechanical stop feature 1280 limits the movement of the semiconductor laser 1220 in a second dimension. Although not shown, contacting another mesa feature of the semiconductor laser 1220 with another mechanical stop feature of the substrate 1210 (e.g., a sidewall orthogonal to the mechanical stop feature 1280) may limit the movement of the semiconductor laser 1220 in a third dimension.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments, and advantages are merely illustrative and are not considered elements or limitations of the appended claims except where explicitly recited in a claim(s).

As will be appreciated by one skilled in the art, the embodiments disclosed herein may be embodied as a system, method, or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:
1. A submount assembly comprising:
    a first substrate having a first surface and an opposing second surface, wherein a plurality of first grooves are formed into the first substrate from the first surface, wherein each first groove is dimensioned to receive a portion of a respective optical fiber of a plurality of optical fibers, and to arrange the optical fiber with a predetermined first height relative to the first surface;
    a plurality of first conductive traces on a side of the first substrate corresponding to the first surface;
    a semiconductor laser contacted with the first conductive traces, wherein the semiconductor laser has a predetermined second height relative to the first surface;
    a plurality of second conductive traces at the second surface; and
    a plurality of first vias extending through the first substrate from the first conductive traces to the second conductive traces,
    wherein the predetermined first height and the predetermined second height are selected such that, when the submount assembly is coupled with a semiconductor substrate, the plurality of optical fibers and the semiconductor laser optically couple with respective optical waveguides of a plurality of optical waveguides of the semiconductor substrate.
2. The submount assembly of claim 1, wherein the first substrate comprises a glass substrate.

3. The submount assembly of claim 1, wherein the first height and the second height are such that the plurality of optical fibers and the semiconductor laser are optically colinear.

4. The submount assembly of claim 1, wherein the first substrate has a third surface recessed from the first surface, and wherein the plurality of first conductive traces are arranged at the third surface.

5. The submount assembly of claim 4, wherein the semiconductor laser defines a mesa feature configured to contact a mechanical stop feature of the first substrate.

6. The submount assembly of claim 1, further comprising:
a second substrate having a third surface, wherein a plurality of second grooves are formed into the second substrate from the third surface,
wherein, when the third surface is contacted with the first surface of the first substrate, each optical fiber of the plurality of optical fibers is arranged between a respective first groove and a respective second groove.

7. The submount assembly of claim 6, wherein the plurality of first vias extend through a region of the first substrate that is non-overlapping with the second substrate, and
wherein the semiconductor laser is non-overlapping with the second substrate.

8. The submount assembly of claim 6,
wherein a recess is formed into the second substrate from the third surface, and
wherein, when the third surface is contacted with the first surface of the first substrate, the semiconductor laser is received in the recess.

9. The submount assembly of claim 8, further comprising:
a plurality of second vias extending through the second substrate from the third surface to an opposing fourth surface, each second via coupled with a respective first conductive trace; and
a plurality of third conductive traces at the fourth surface, each third conductive trace coupled with a respective second via.

10. An optical apparatus comprising:
a semiconductor substrate having a first surface and a plurality of optical waveguides arranged with a predetermined first height relative to the first surface;
a semiconductor laser;
a plurality of optical fibers; and
a submount assembly comprising:
a base member having a second surface and an opposing third surface, the second surface contacting the first surface, wherein a plurality of first grooves are formed into the base member from the second surface, wherein each first groove receives a portion of a respective optical fiber of the plurality of optical fibers, and arranges the optical fiber to be optically coupled with a respective optical waveguide of the plurality of optical waveguides;
a plurality of first conductive traces on a side of the base member corresponding to the first surface, wherein the semiconductor laser is contacted with the first conductive traces and has a predetermined second height relative to the first surface;
a plurality of second conductive traces at the third surface; and
a plurality of first vias extending through the base member from the first conductive traces to the second conductive traces.

11. The optical apparatus of claim 10, wherein the base member comprises a glass substrate.

12. The optical apparatus of claim 10, wherein the plurality of optical fibers and the semiconductor laser are optically colinear.

13. The optical apparatus of claim 10, wherein a recess is formed into the semiconductor substrate from the first surface, and
wherein the semiconductor laser is received in the recess.

14. The optical apparatus of claim 10, wherein the submount assembly further comprises:
a lid member having a fourth surface contacting the third surface, wherein a plurality of second grooves are formed into the lid member from the fourth surface,
wherein each optical fiber of the plurality of optical fibers is arranged between a respective first groove and a respective second groove.

15. The optical apparatus of claim 14, further comprising:
a plurality of second vias extending through the lid member from the fourth surface to an opposing fifth surface, each second via coupled with a respective first conductive trace; and
a plurality of third conductive traces at the fifth surface, each third conductive trace coupled with a respective second via.

16. A method comprising:
forming a plurality of first vias through a base member, the base member having a first surface and an opposing second surface;
forming a plurality of first conductive traces on a side of the base member corresponding to the first surface;
forming a plurality of second conductive traces at the second surface, wherein the first vias extend between the first conductive traces and the second conductive traces;
forming a plurality of first grooves from the first surface into the base member;
attaching a plurality of optical fibers to the base member, wherein attaching the plurality of optical fibers comprises inserting the plurality of optical fibers into the plurality of first grooves, wherein the plurality of optical fibers have a predetermined first height relative to the first surface; and
attaching a semiconductor laser to the base member, wherein attaching the semiconductor laser comprises contacting the semiconductor laser with the first conductive traces, wherein the semiconductor laser has a predetermined second height relative to the first surface,
wherein the predetermined first height and the predetermined second height are selected such that, when the base member is coupled with a semiconductor substrate, the plurality of optical fibers and the semiconductor laser optically couple with respective optical waveguides of a plurality of optical waveguides of the semiconductor substrate.

17. The method of claim 16, further comprising:
attaching a lid member to the base member, wherein the first surface contacts a third surface of the lid member, wherein a plurality of second grooves are formed into the lid member from the third surface, wherein each optical fiber of the plurality of optical fibers is arranged between a respective first groove and a respective second groove.

18. The method of claim 17, further comprising:
attaching the base member to the semiconductor substrate,
wherein the first surface contacts a fourth surface of the semiconductor substrate, and wherein the plurality of optical waveguides are arranged relative to the fourth surface.

19. The method of claim 16, wherein attaching the semiconductor laser to the base member comprises contacting a mesa feature of the semiconductor laser with a mechanical stop feature of the base member.

20. The method of claim 16, wherein the base member comprises a glass substrate, and wherein forming a plurality of first vias comprises anisotropic etching of the glass substrate.

* * * * *

UNITED STATES PATENT AND TRADEMARK OFFICE
CERTIFICATE OF CORRECTION

| | | |
|---|---|---|
| PATENT NO. | : 10,547,156 B1 | Page 1 of 1 |
| APPLICATION NO. | : 16/052441 | |
| DATED | : January 28, 2020 | |
| INVENTOR(S) | : Jock T. Bovington et al. | |

It is certified that error appears in the above-identified patent and that said Letters Patent is hereby corrected as shown below:

In the Specification

In Column 2, Line 6, after "It is" insert -- contemplated that elements disclosed in one embodiment may be beneficially utilized on other embodiments without specific recitation. --.

In Column 8, Line 51, delete "unmetalized" and insert -- unmetallized --, therefor.

Signed and Sealed this
Second Day of June, 2020

Andrei Iancu
*Director of the United States Patent and Trademark Office*